(12) United States Patent
Kang et al.

(10) Patent No.: US 7,944,739 B2
(45) Date of Patent: *May 17, 2011

(54) PHASE CHANGE MEMORY DEVICE WITH BIT LINE DISCHARGE PATH

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 258 days.

This patent is subject to a terminal disclaimer.

(21) Appl. No.: 12/146,539

(22) Filed: Jun. 26, 2008

(65) Prior Publication Data

US 2009/0027954 A1 Jan. 29, 2009

(30) Foreign Application Priority Data

Jul. 24, 2007 (KR) .................. 10-2007-0073855

(51) Int. Cl.
*G11C 11/00* (2006.01)
(52) U.S. Cl. ..................................... 365/163; 365/210.1
(58) Field of Classification Search .................. 365/163, 365/210.1, 203, 148, 100
See application file for complete search history.

(56) References Cited

U.S. PATENT DOCUMENTS

| | | | | |
|---|---|---|---|---|
| 6,879,513 | B2* | 4/2005 | Ooishi | 365/158 |
| 6,909,656 | B2* | 6/2005 | Moore et al. | 365/222 |
| 7,248,494 | B2* | 7/2007 | Oh et al. | 365/148 |
| 7,688,622 | B2* | 3/2010 | Kang et al. | 365/163 |
| 2003/0067321 | A1* | 4/2003 | Turner | 326/39 |
| 2004/0051094 | A1* | 3/2004 | Ooishi | 257/5 |
| 2004/0257854 | A1* | 12/2004 | Chen et al. | 365/148 |
| 2005/0201182 | A1* | 9/2005 | Osada et al. | 365/230.03 |
| 2006/0250863 | A1* | 11/2006 | Nakai et al. | 365/200 |
| 2007/0103972 | A1* | 5/2007 | Ro et al. | 365/163 |

FOREIGN PATENT DOCUMENTS

| KR | 2007-0060685 A | 6/2007 |
|---|---|---|
| KR | 2007-0073304 A | 7/2007 |

* cited by examiner

*Primary Examiner* — VanThu Nguyen
*Assistant Examiner* — Douglas King
(74) *Attorney, Agent, or Firm* — Ladas & Parry LLP

(57) ABSTRACT

A phase change memory device includes a cell array. The cell array includes a phase change resistance cell formed at an intersection of a word line and a bit line and a dummy cell configured to discharge the bit line in response to a bit line discharge signal in a precharge mode. A column switching unit is configured to selectively control a connection between the bit line and a global bit line in response to a column selecting signal.

10 Claims, 11 Drawing Sheets

PHASE CHANGE MEMORY DEVICE WITH BIT LINE DISCHARGE PATH

CROSS-REFERENCE TO RELATED APPLICATION

The present application is based upon and claims priority to Korean Patent Application No. 10-2007-73855 filed on Jul. 24, 2007 which is incorporated herein by reference in its entirety.

BACKGROUND OF THE INVENTION

The present invention relates generally to a phase change memory device, and more particularly, to a phase change memory device for enhancing an operating characteristic of a main cell which includes a discharge path of a bit line and a dummy cell array.

A nonvolatile memory has a data processing speed similar to that of a volatile Random Access Memory (RAM), however, unlike a volatile RAM, a nonvolatile memory conserves a data even when no power is supplied to the memory, i.e., when the power is turned off. Examples of a nonvolatile memory include a magnetic memory and a phase change memory (PCM).

FIGS. 1a and 1b are diagrams showing a conventional phase change resistor (PCR) 4.

The PCR 4 comprises a phase change material (PCM) 2 inserted between an upper electrode 1 and a lower electrode 3. When a voltage and a current are applied to the conventional PCR 4, a high temperature is generated in the PCM 2 such that an electric conductive state of the PCR 4 is changed depending on resistance of the PCM 2. The PCM includes AgLnSbTe. The PCM 2 may comprise chalcogenide having chalcogen elements (S, Se, Te) as a main ingredient, and specifically includes a germanium antimonic tellurium consisting of Ge—Sb—Te.

FIGS. 2a and 2b are diagrams illustrating a principle of the conventional PCR 4.

As shown in FIG. 2a, the PCM 2 can be crystallized when a low current, i.e., a current less than a threshold value flows in the PCM R. As a result, the PCM2 is crystallized to be a low resistant material.

As shown in FIG. 2b, the PCM 2 can be amorphized when a is high current, i.e., a current higher than a threshold value, flows into the PCR 4. That is the temperature of the PCM 2 is increased higher than the melting point of the PCM 2 when a high current flows into the PCR 4. As a result, the PCM 2 becomes amorphous and acts as a high resistance material.

In this way, the PCR 4 is configured to store nonvolatile data corresponding to the two resistance states. Data "1" refers to a low resistance state of the PCR 4, and data "0" refers to a high resistance state of the PCR 4, and as such the data can be stored to have one of the two logic states.

FIG. 3 is a diagram showing a write operation of a conventional phase change resistant cell.

Heat is generated when a current flows through the top electrode 1 and the bottom electrode 3 of the PCR 4 for a given time. As a result, a state of the PCM 2 is changed to be either crystalline or amorphous depending on the temperature generated according to the current applied to the upper electrode 1 and the lower electrode 3.

A low temperature heating state occurs when a low current flows for a given time. As a result, the PCM 2 becomes crystalline and the PCR 4, which acts as a low resistor, is at a set state. On the other hand, a high temperature heating state occurs when a high current flows for a given time. As a result, the PCM 2 becomes amorphous and the PCR 4, which acts as a high resistor, is at a reset state. A difference between two phases is represented by a change in electric resistance.

As shown in FIG. 3, a low voltage is applied to the PCR 4 for a long period of time in order to write the set state in a write mode. On the other hand, a high voltage, which is greater than the low voltage, is applied to the PCR 4 for a shorter period of time in order to write the reset state in the write mode.

FIG. 4 is a diagram showing a cell array of a conventional phase change memory device.

The conventional cell array includes a plurality of unit cell C arranged intersections of a plurality of bit lines BL1~BL4 and a plurality of word lines WL1~WL4. The unit cell C includes a phase change resistor PCR and a diode D. The diode D includes a PN diode element.

The phase change resistor has one electrode connected to a bit line BL and the other electrode connected to a P-type region of the diode D. An N-type region of the diode D is connected to a word line WL.

In a read mode, a low voltage is transmitted to the selected word line WL. A read voltage Vread is transmitted to the bit line BL so that a read current Iset, having a set state, or a read current Ireset, having a reset state, flows toward the word line through the bit line BL, the phase change resistor PCR, and the diode D.

A sense amplifier S/A senses cell data applied through the bit line BL and compares the cell data with a reference voltage ref to distinguish data "1" from "0". A reference current Iref flows in the reference voltage ref terminal. A write driving unit W/D supplies a driving voltage, which corresponds to write data to the bit line BL, when data are written in a cell.

FIG. 5 is a circuit diagram illustrating a conventional phase change memory device.

The phase change memory device includes a plurality of cell arrays CA_m, CA_n, bit line discharge switches N1~N8 for discharging charges of the bit line BL in a precharge mode, and column switches N9~N16. Each of the cell arrays CA_m, CA_n includes a unit cell C arranged at an intersection of the bit line BL and the word line WL.

The bit line discharge switches N1~N8 are connected between a bit line BL and a ground voltage terminal, and are controlled by bit line discharge signals BLDIS_m, BLDIS_n. When the bit line discharge signals BLDIS_m, BLDIS_N are activated, the bit line discharge switches N1~N8 are switched on and supply a ground voltage to the bit line BL and provide a discharge path for the bit line BL.

The column switches N9~N16 are connected between a bit line BL and a global bit line GBL, and are controlled by column selecting signals LY1_m~LY4_m and LY1_m~LY4_n. The column switches N9~N16 are selectively switched on in response to the column selecting signals LY1_m~LY4_m and LY1_n~LY4_n and control the connection between the bit line BL and the global bit line GBL.

In an active mode, one of the column selecting signals LY1_m~LY4_m is activated selecting the unit cell C connected to a corresponding to the bit line BL, and one of the column selecting signal LY1_n~LY4_n is activated selecting the unit cell C connected to a corresponding to the bit line BL.

In the conventional memory device, the bit line discharge signal BLDIS is inactivated to a low level during the active cycle. In the precharge period, the bit line discharge signal BLDIS is activated to a high level to discharge the bit line BL to a ground voltage.

The bit line discharge switches N1~N8 include NMOS transistors. The phase change memory device includes additional bit line discharge switches N1~N8 outside the cell array CA. As a result, the conventional memory device must include additional switch regions in order to provide a discharge path of the bit line, which results in a greater overall size of the device.

SUMMARY

Disclosed is a phase change memory device.

The present invention includes a phase change memory device including a phase change resistance cell and a dummy cell array configured to perform a bit line switch function without circuits for forming additional discharge paths.

An embodiment of the present invention includes forming a discharge path of a bit line in a dummy cell array, thereby enhancing an operation characteristic of a main cell and reducing overall layout area.

According to one embodiment, a phase change memory device comprises: a cell array comprising a phase change resistance cell formed at an intersection of a word line and a bit line; and a dummy cell configured to discharge the bit line in response to a bit line discharge signal in a precharge mode; and a column switching unit configured to selectively a control connection between the bit line and a global bit line in response to a column selecting signal.

DETAILED DESCRIPTION

Figure 1A:
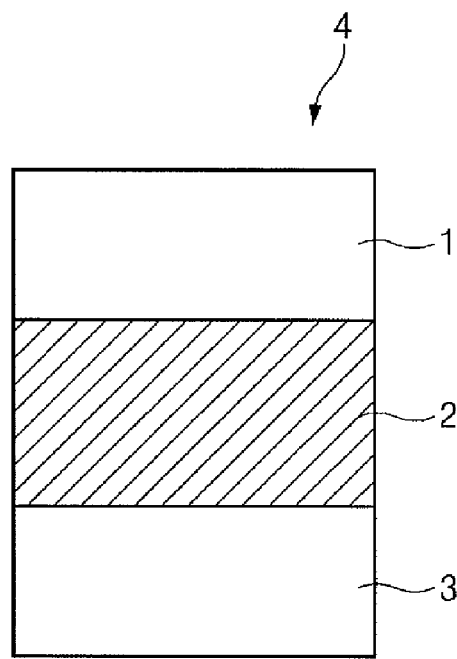
FIGS. 1a and 1b are diagrams showing a conventional phase change resistor.
Figure 1B:
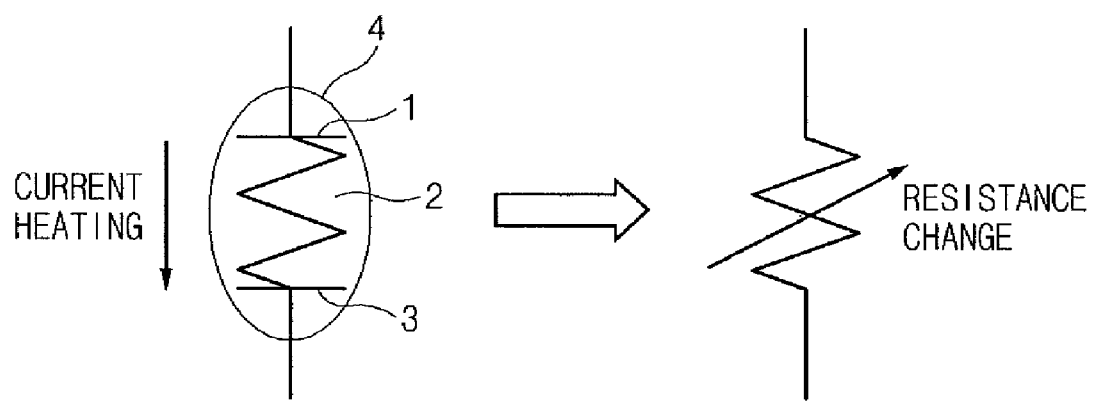
Figure 2A:
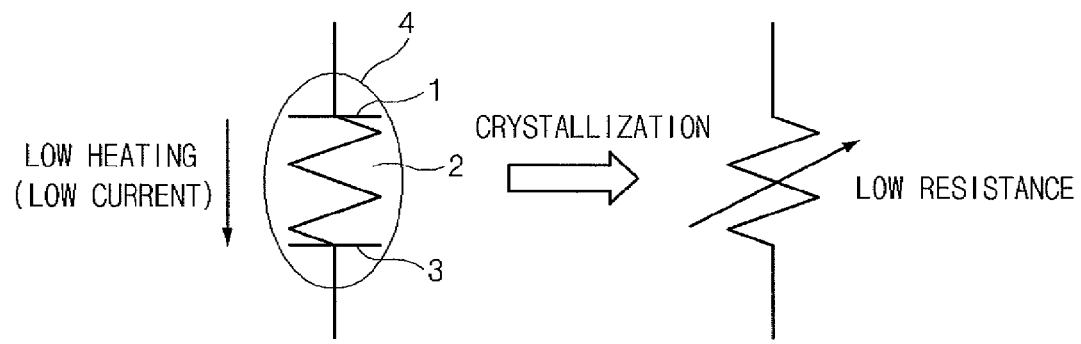
FIGS. 2a and 2b are diagrams showing an operating principle of the conventional phase change resistor.
Figure 2B:
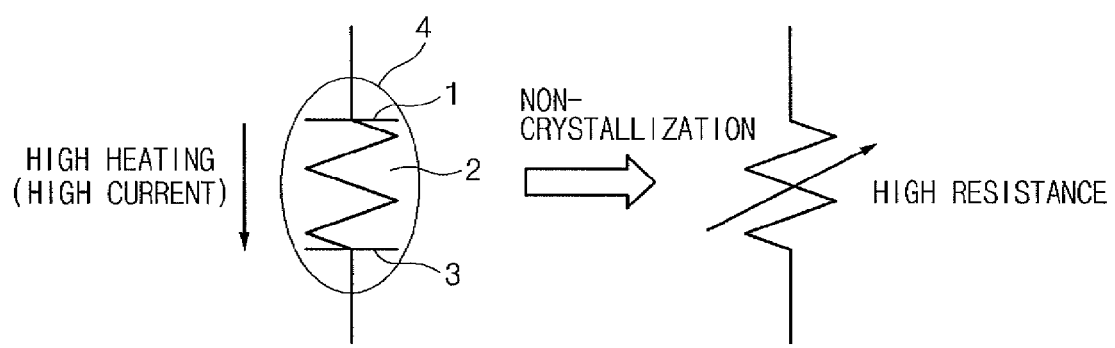
Figure 3:
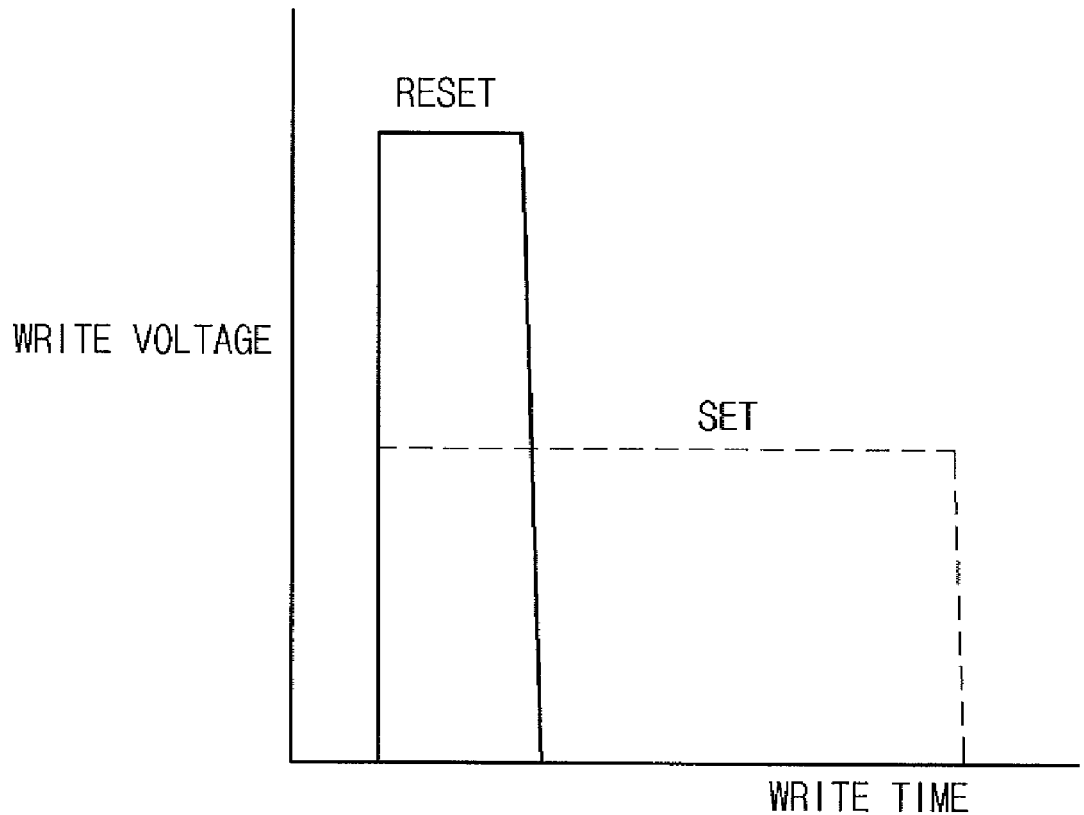
FIG. 3 is a diagram showing a write operation of a conventional phase change resistant cell.
Figure 4:
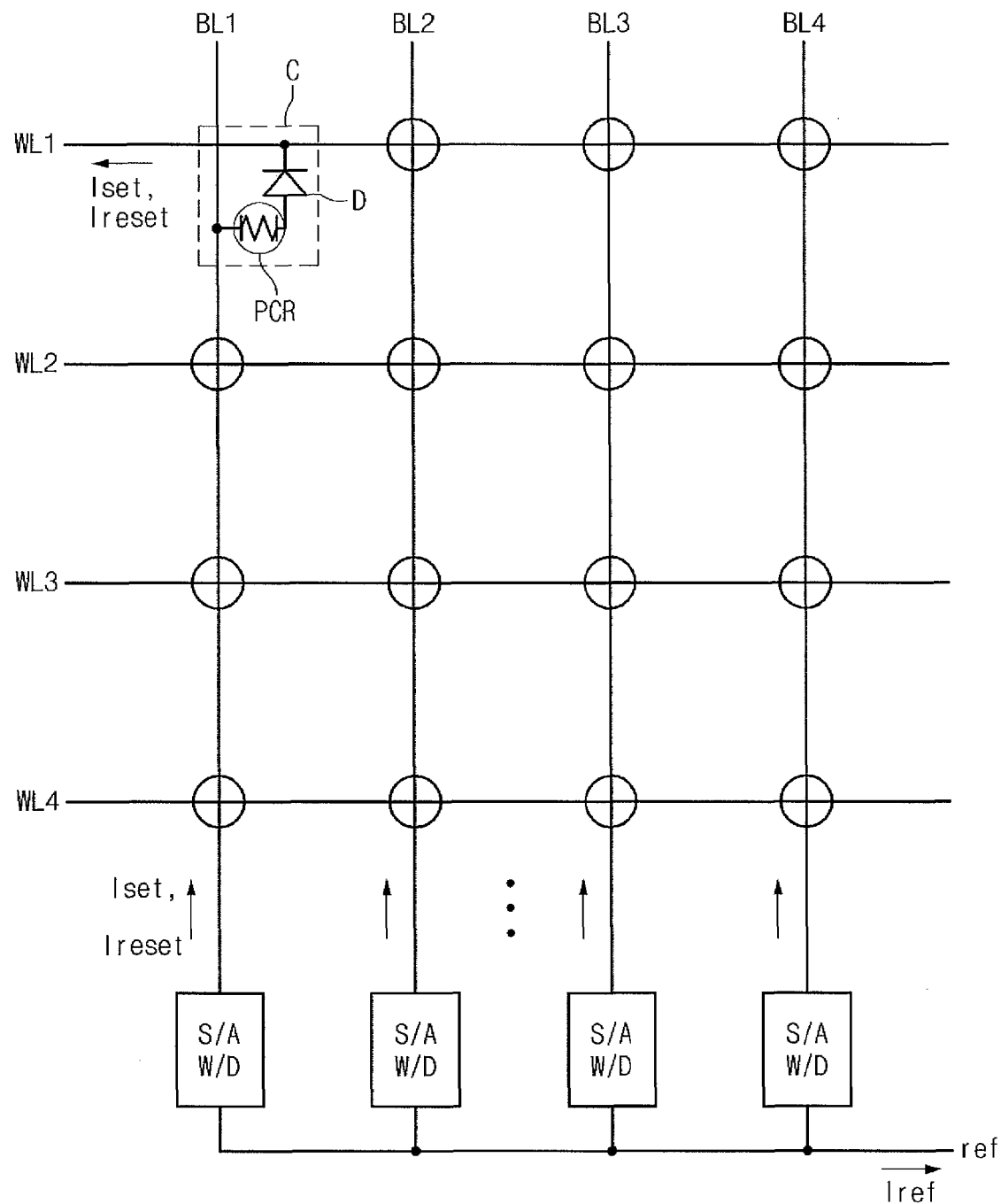
FIG. 4 is a diagram showing a cell array of a conventional change memory device.
Figure 5:
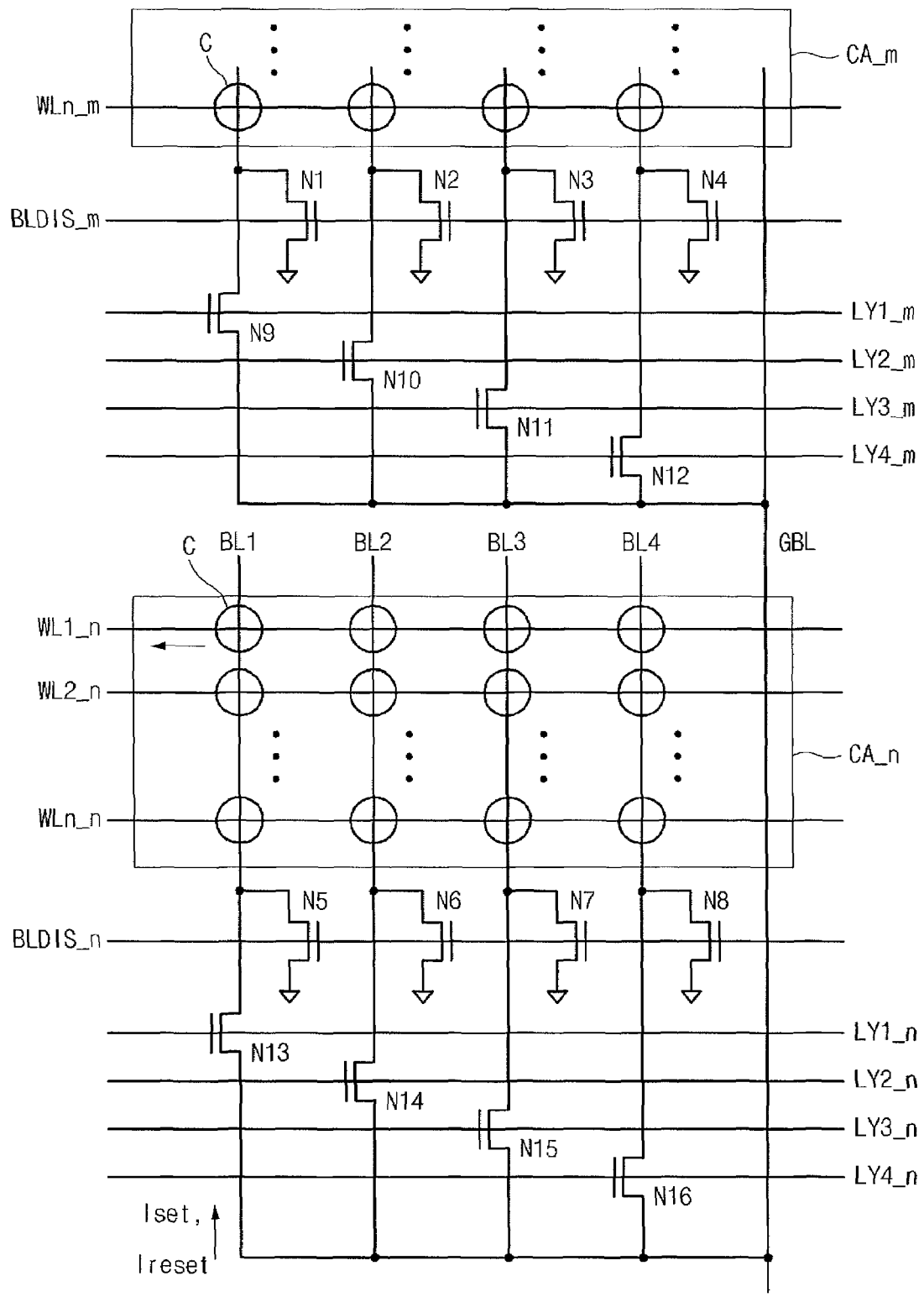
FIG. 5 is a circuit diagram showing a conventional phase change memory device.
Figure 6:
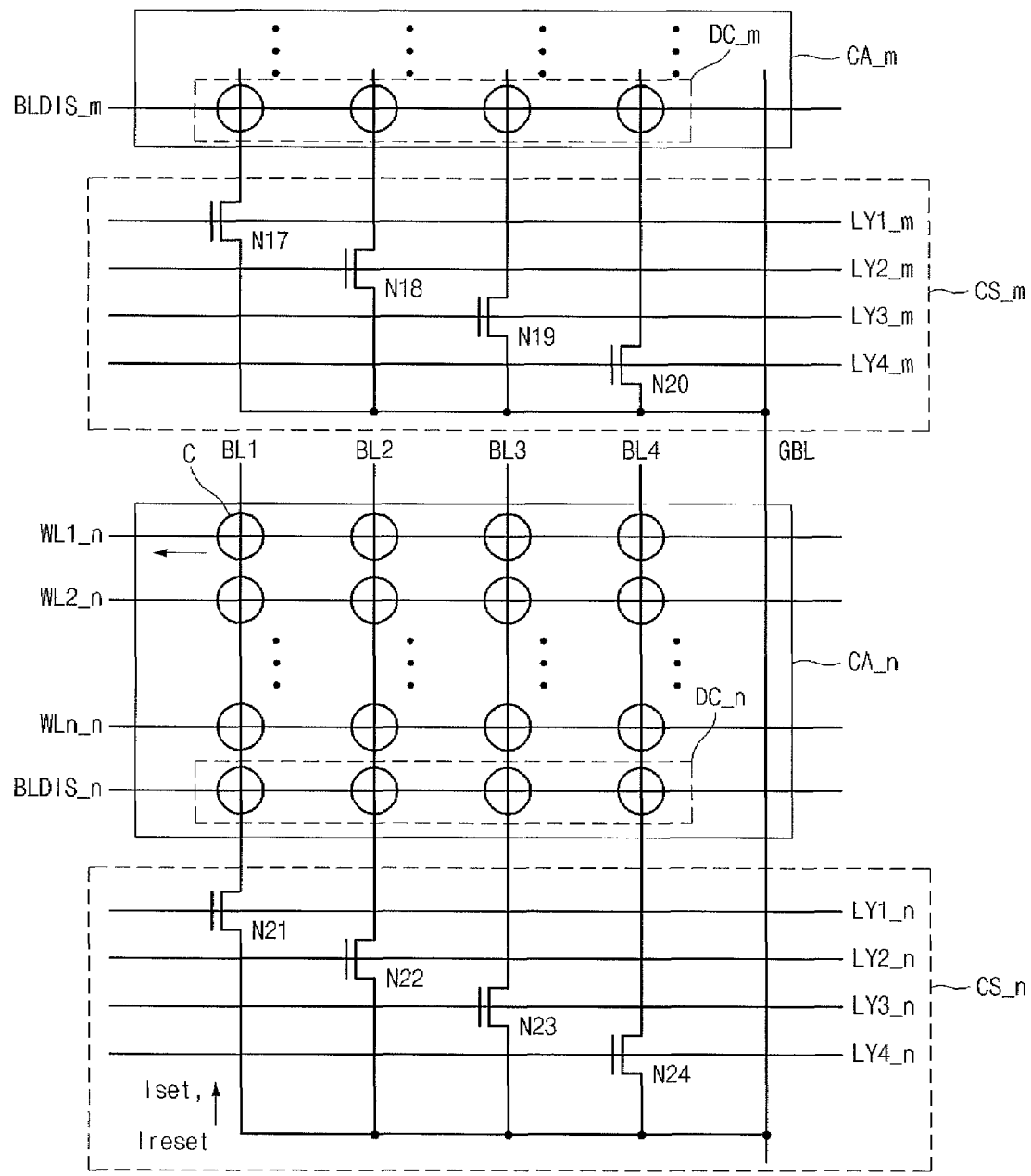
FIG. 6 is a diagram showing a phase change memory device according to an embodiment of the present invention.

FIG. 6 is a diagram illustrating a phase change memory device according to an embodiment of the present invention.

The phase change memory device comprises a plurality of cell arrays CA_m, CA_n and a column switching unit CS_m, CS_n. The column switching unit CS_m, CS_n includes NMOS transistors N17~N24. Each of the cell arrays CA_m, CA_n includes a unit cell C and dummy cells DC_m, DC_n.

Each of the unit cells C is formed at an intersection of a bit line BL and a word line WL. The dummy cell DC_m is connected between the bit lines BL1~BL4 and the NMOS transistors N17~N20 and is controlled by a bit line discharge signal BLDIS_m. The dummy cell DC_n is connected between the bit line BL and the NMOS transistors N21~N24 and controlled by a bit line discharge signal BLDIS_n.

The NMOS transistors N17~N20 are connected between the bit lines BL1~BL4 and a global bit line GBL, and gates of the NMOS transistors N17~N20 receive column selecting signals LY1_m~LY4_m. The NMOS transistors N21~N24 are connected between the bit lines BL1~BL4 and the global bit line GBL, and gates of the NMOS transistors N21~N24 receive column selecting signals LY1_m~LY4_m.

The NMOS transistors N17~N24 are selectively switched on in response to the column selecting signals LY1_m~LY4_m, LY1_n~LY4_n and control connections between the bit lines BL1~BL4 and the global bit line GBL.

In an active mode, one of the column selecting signals LY1_m~LY4_m is activated selecting the unit cell C connected to a corresponding bit line BL. One of the column selecting signals LY1_n~LY4_n is activated selecting the unit cell C connected to a corresponding bit line BL.

Figure 7:
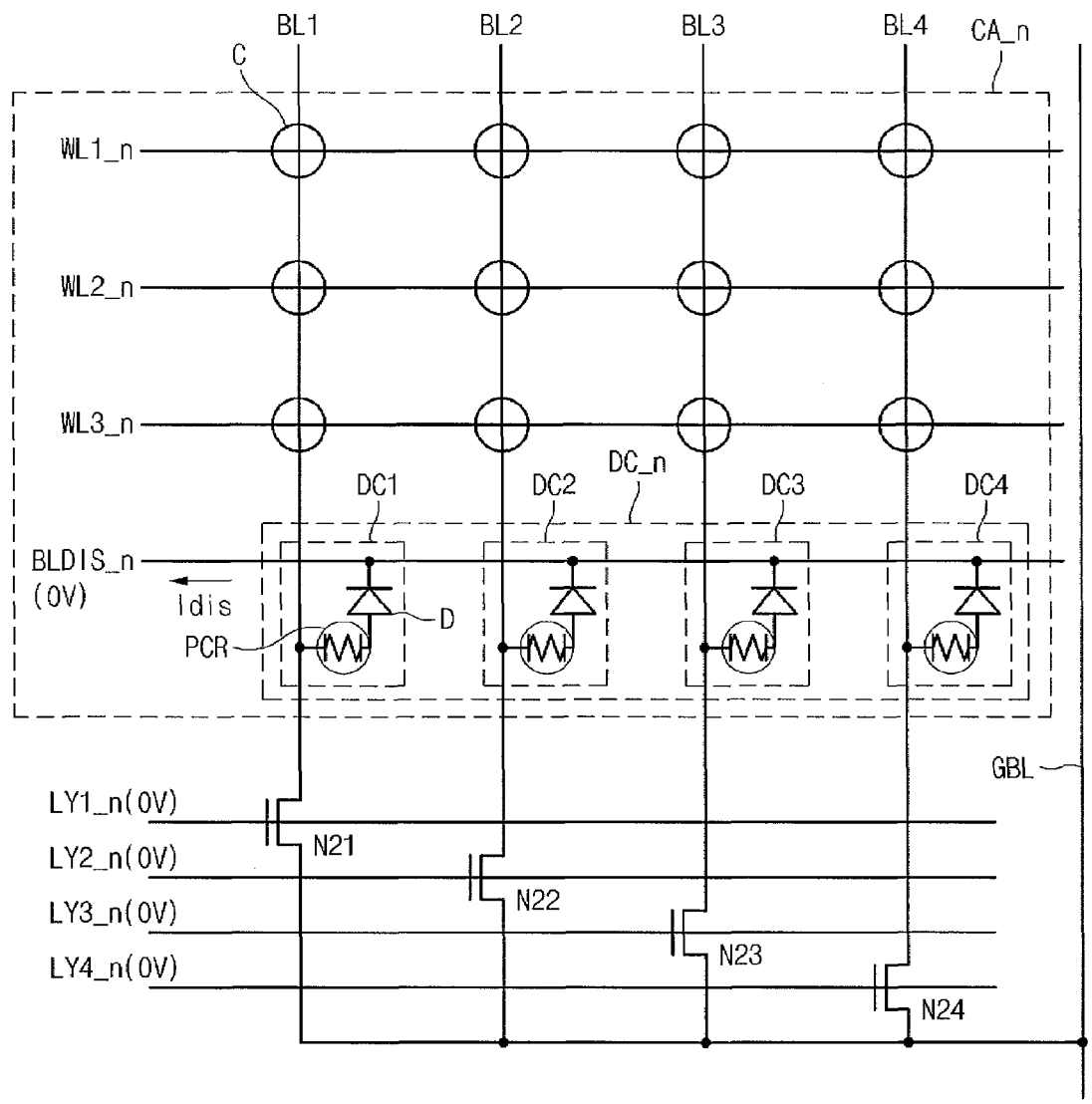
FIG. 7 is a diagram showing a bias condition of a precharge mode of a cell array of FIG. 6.

FIG. 7 is a diagram showing a bias condition of a precharge mode of a cell array of FIG. 6.

The cell array CA_n includes the unit cell C and the dummy cell DC_n. The unit cell C is formed at an intersection of a bit line BL and a word line WL. The dummy cell DC_n includes a plurality of dummy unit cells DC1~DC4 arranged at an intersection of the bit line BL and a bit line discharge signal BLDIS_n terminal.

The dummy cells DC_n are configured to discharge the bit line BL in a precharge mode and have the same structure as the unit cell C. That is each of the dummy unit cells DC1~DC4 includes a phase change resistor PCR and a diode D. The diode D includes a PN diode element.

The phase change resistor PCR has one electrode connected to the bit line BL and the other electrode connected to a P-type region of the diode D. An N-type region of the diode D is connected to the bit line discharge signal BLDIS_n terminal.

In the active mode, the bit line discharge signal BLDIS_n becomes a 'high' level and disconnects a current path. In the precharge mode, the bit line discharge signal BLDIS_n becomes a 'low' level and discharges the bit line BL to a ground voltage level. The column selecting signals LY1_n~LY4_n are inactivated to the 'low' level and maintained in an off state.

A low voltage is transmitted to the selected word line WL in a read mode. A read voltage Vread is transmitted to the bit line BL so that a read current Iset having a set state or a read current Ireset having a reset state flows toward the word line WL through the bit line BL, the phase change resistor PCR, and the diode D.

Figure 8:
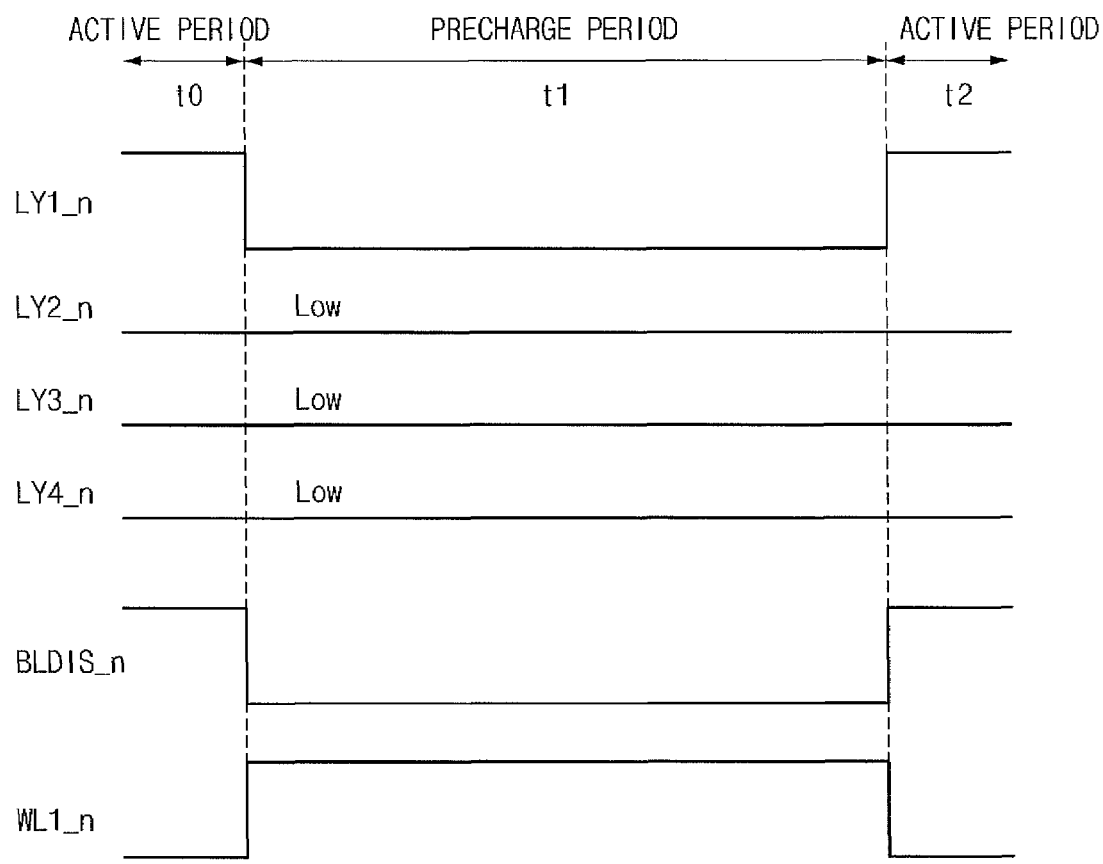
FIG. 8 is a waveform diagram showing the precharge mode of FIG. 7.

FIG. 8 is a waveform diagram showing the precharge mode of FIG. 7.

During an active period t0, the column selecting signal LY1_n of the column selecting signal LY1_n~LY4_n is activated to a high level and the column selecting signals LY2_n~LY4_n are maintained at the 'low' level. The gate of the NMOS transistor N21 receives the column selecting signal LY1_n and the NMOS transistor N21 is turned on in response to the column selecting signal LY1_n having the high level. The remaining NMOS transistors N22~N24 are maintained in an off state. As a result, the bit line BL1, which corresponds to the NMOS transistor N21 is connected to the global bit line GBL.

The bit line discharge signal BLDIS_n is maintained at a 'high' level inactivating the dummy cell DC. The selected word line WL1_n is maintained at a 'low' level activating the unit cell C.

During a precharge period t1, the column selecting signals LY1_n~LY4_n become the 'low' level, and as such the NMOS transistors N21~N24 are switched off. As a result, the bit line BL is disconnected from the global bit line GBL.

The bit line discharge signal BLDIS_n maintains the 'low' level activating the dummy cell DC. That is, in the precharge period t1, the bit line discharge signal BLDIS_n transitions to the 'low' level discharging the bit line BL through the phase change resistor PCR and the diode D. The selected word line WL1_n maintains the "high" level inactivating the unit cell C.

During an active period t2, the column selecting signal LY1_n and the bit line discharge signal BLDIS_n are transitioned to the 'high' level. The word line WL1_n is transitioned back to the 'low' level to perform an active operation.

Figure 9:
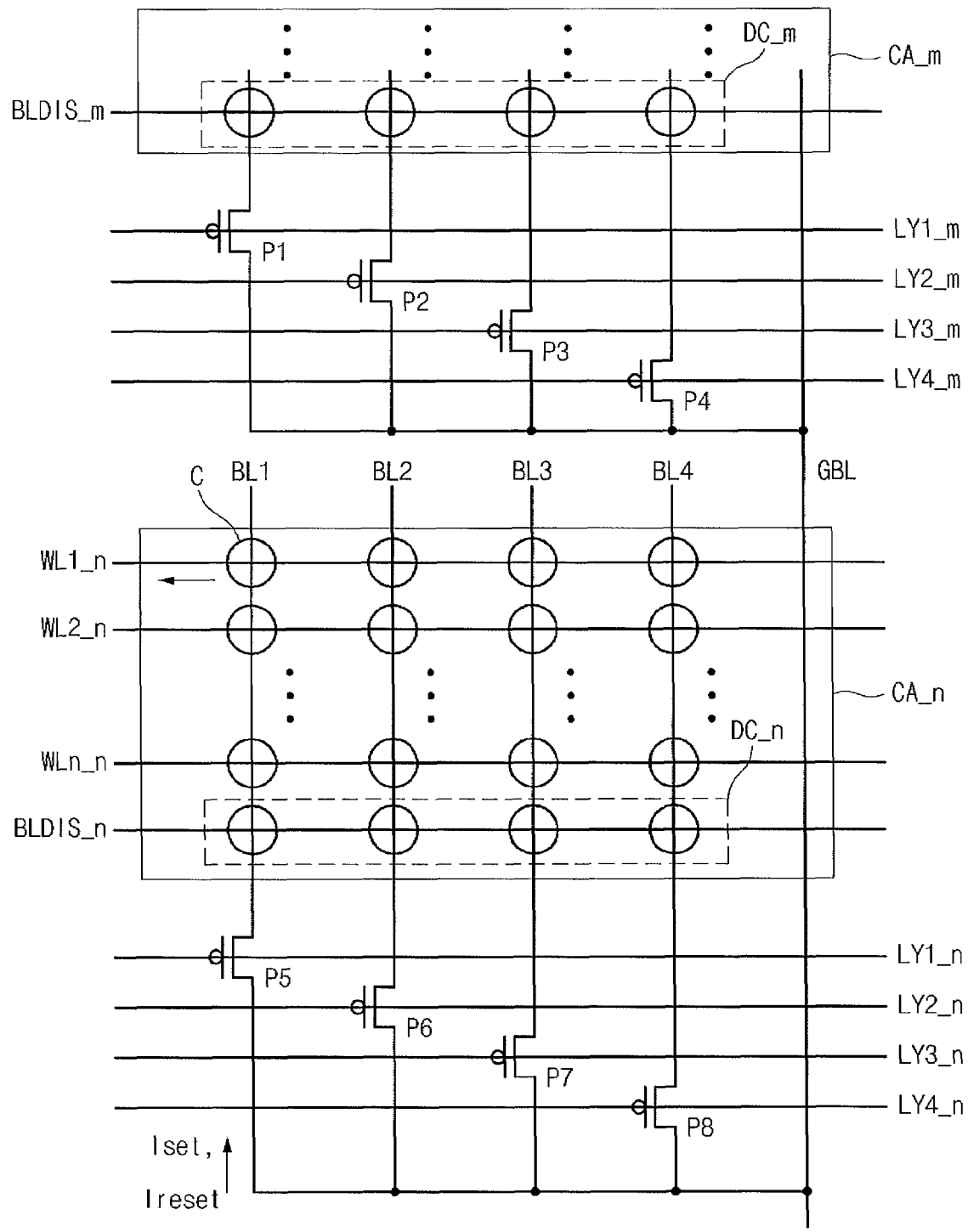
FIG. 9 is diagram showing a cell array of a phase change memory device consistent with the present invention.

FIG. 9 is diagram showing a cell array of a phase change memory device according to an embodiment of the present invention.

The phase change memory device includes a plurality of cell arrays CA_m, CA_n and a column switching unit CS_m, CS_n. The column switching unit CS_m, CS_n includes PMOS transistors P1~P8. Each of the cell arrays CA_m, CA_n includes a unit cell C and dummy cells DC_m, DC_n.

Each of the unit cells C is formed at an intersection of a bit line BL and a word line WL. The dummy cell DC_m is connected between the bit lines BL1~BL4 and the PMOS transistors P1~P4 and is controlled by a bit line discharge signal BLDIS_m. The dummy cell DC_n is connected between the bit line BL and the PMOS transistors P5~P8 and controlled by a bit line discharge signal BLDIS_n.

The PMOS transistors P1~P4 are connected between the bit lines BL1~BL4 and a global bit line GBL have, and gates of the PMOS transistors P1~P4 receive column selecting signals LY1_m~LY4_m. The PMOS transistors P5~P8 are connected between the bit lines BL1~BL4 and the global bit line GBL, and gates of the PMOS transistors P1~P4 receive column selecting signals LY1_m~LY4_m.

The PMOS transistors P1~P8 are selectively switched on in response to the column selecting signals LY1_m~LY4_m, LY1_n~LY4_n and control connections between the bit lines BL1~BL4 and the global bit line GBL.

In the active mode, one of the column selecting signals LY1_m~LY4_m is activated selecting the unit cell C connected to a corresponding bit line BL. One of the column selecting signals LY1_n~LY4_n is activated selecting the unit cell C connected to a corresponding bit line BL.

Figure 10:
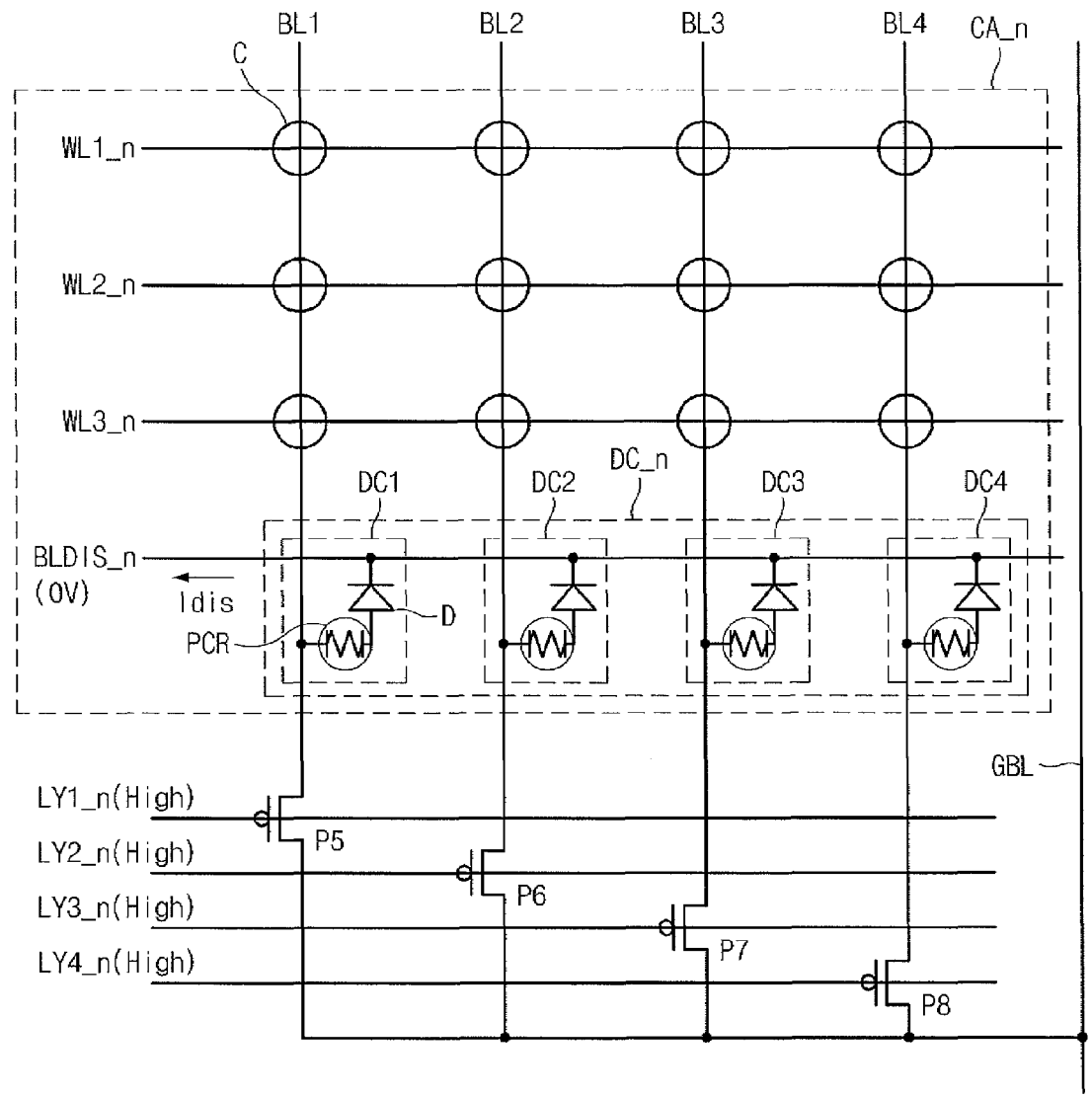
FIG. 10 is a diagram showing a bias condition of a precharge mode of the cell array of FIG. 9.

FIG. 10 is a diagram showing a bias condition of a precharge mode of the cell array of FIG. 9.

The cell array CA_n includes the unit cell C and the dummy cell DC_n. The unit cell C is formed at an intersection of a bit line BL and a word line WL. The dummy cell DC_n includes a plurality of dummy unit cells DC1~DC4 arranged at an intersection of the bit line BL and a bit line discharge signal BLDIS_n terminal.

The dummy cells DC_n are configured to discharge the bit line BL in a precharge mode and have the same structure as the unit cell C. That is, each of the dummy unit cells DC1~DC4 includes a phase change resistor PCR and a diode D. The diode D includes a PN diode element.

The phase change resistor PCR has one electrode connected to the bit line BL and the other electrode connected to a P-type region of the diode D. An N-type region of the diode D is connected to the bit line discharge signal BLDIS_n terminal.

In the active mode, the bit line discharge signal BLDIS_n becomes a 'high' level and disconnects a current path. In the precharge mode, the bit line discharge signal BLDIS_n becomes a 'low' level and discharges the bit line BL to a ground voltage level. The column selecting signals LY1_n~LY4_n are inactivated to the 'low' level and maintained in an off state.

A low voltage is transmitted to the selected word line WL in a read mode. A read voltage Vread is transmitted to the bit line BL so that a read current Iset having a set state or a read current Ireset having a reset state flows toward the word line WL through the bit line BL, the phase change resistor PCR, and the diode D.

Figure 11:
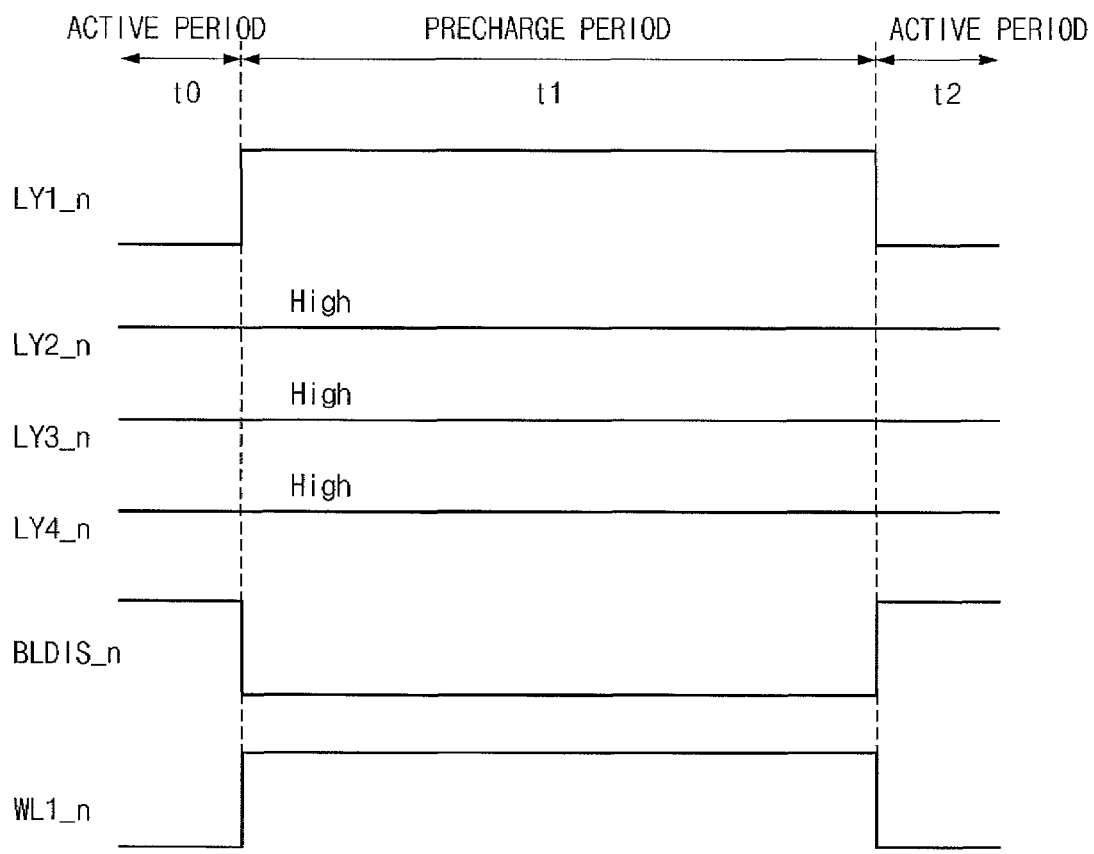
FIG. 11 is a waveform diagram showing the precharge mode of FIG. 10.

FIG. 11 is a waveform diagram showing the precharge mode of FIG. 10.

During an active period to, the column selecting signal LY1_n of the column selecting signal LY1_n~LY4_n is activated to a low level and the column selecting signals LY2_n~LY4_n are maintained at the 'high'. The gate of the PMOS transistor P5 receives the column selecting signal LY1_n and the PMOS transistor P5 is turned on in response to the column selecting signal LY1_n having the low level. The remaining PMOS transistors P6~P8 are maintained in an off state. As a result, the bit line BL1, which corresponds to the NMOS transistor N21 is connected to the global bit line GBL.

The bit line discharge signal BLDIS_n is maintained at the 'high' level inactivating the dummy cell DC. The selected word line WL1_n is maintained at a 'low' level activating the unit cell C.

During a precharge period t1, the column selecting signals LY1_n~LY4_n become the 'high' level, and as such the PMOS transistors P5~P8 are switched off. As a result, the bit line BL is disconnected from the global bit line GBL.

The bit line discharge signal BLDIS_n maintains the 'low' level activating the dummy cell DC. That is, in the precharge period t1, the bit line discharge signal BLDIS_n transitions to the 'low' level discharging the bit line BL through the phase change resistor PCR and the diode D. The selected word line WL1_n maintains the 'high' level inactivating the unit cell C.

During an active period t2, the column selecting signal LY1_n is transitioned to the 'low' level and the bit line discharge signal BLDIS_n is transitioned to the 'high'. The word line WL1_n is transitioned back to the "low" level to perform an active operation.

As described above, a phase change memory device consistent with the present invention includes a phase change resistance cell and a dummy cell array configured to perform a bit line switch function without requiring additional circuits for forming additional discharge paths. The dummy cell array has a discharge path of a bit line, thereby enhancing a characteristic of a main cell and reducing the overall layout area.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combinations arrangement within the scope of the disclosure, the drawings and the appended claims. In addition to variations and modifications in the component parts and/or arrangements, alternative uses will also be apparent to those skilled in the art.

What is claimed is:

1. A phase change memory device comprising:
   a cell array comprising:
   a phase change resistance cell formed at an intersection of a word line and a bit line; and
   a dummy cell configured to discharge the bit line through a bit line discharge signal terminal in response to a bit line discharge signal in a precharge mode wherein the bit line discharge signal is activated to a low level in the precharge mode and inactivated to a high level in an active mode; and a column switching unit configured to selectively control a connection between the bit line and a global bit line in response to a column selecting signal, wherein the dummy cell comprises:

a first phase change resistor connected to the bit line and configured to change a phase, wherein the phase change occurs depending on the level of a current applied to the first phase change resistor storing data corresponding to a resistance change; and a first diode element connected between the first phase change resistor and the bit line discharge signal terminal.

2. The phase change memory device according to claim 1, wherein the dummy cell has the same structure as that of the phase change resistance cell.

3. The phase change memory device according to claim 1, wherein the phase change resistance cell comprises:

a second phase change resistor configured to change a phase, wherein the phase change occurs depending on the level of a current applied to the second phase change resistor storing data corresponding to a resistance change; and a second diode element connected between the second phase change resistor and the word line.

4. The phase change memory device according to claim 1, wherein the first diode element comprises a PN diode.

5. The phase change memory device according to claim 1, wherein the first diode element has a P-type region connected to the first phase change resistor and an N-type region connected to the bit line discharge signal terminal.

6. The phase change memory device according to claim 1, wherein the column switching unit comprises an NMOS transistor connected between the bit line and the global bit line, wherein a gate of the NMOS transistor receives the column selecting signal.

7. The phase change memory device according to claim 1, wherein the column selecting signal is inactivated to a low level in the precharge mode.

8. The phase change memory device according to claim 1, wherein the column switching unit comprises a PMOS transistor connected between the bit line and the global bit line, wherein a gate of the PMOS transistor receives the column selecting signal.

9. The phase change memory device according to claim 8, wherein the column selecting signal is inactivated to a high level in the precharge mode.

10. The phase change memory device according to claim 1, wherein the global bit line is shared by a plurality of cell arrays.

* * * * *